United States Patent
Sakurai et al.

(10) Patent No.: US 10,455,700 B2
(45) Date of Patent: Oct. 22, 2019

(54) ELECTRONIC DEVICE AND DISPLAY UNIT

(71) Applicant: Panasonic Intellectual Property Management Co., Ltd., Osaka (JP)

(72) Inventors: Kazuho Sakurai, Kanagawa (JP); Hiromu Kita, Osaka (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 133 days.

(21) Appl. No.: 15/110,734

(22) PCT Filed: Feb. 26, 2015

(86) PCT No.: PCT/JP2015/000987
§ 371 (c)(1),
(2) Date: Jul. 9, 2016

(87) PCT Pub. No.: WO2015/145975
PCT Pub. Date: Oct. 1, 2015

(65) Prior Publication Data
US 2016/0338197 A1  Nov. 17, 2016

(30) Foreign Application Priority Data
Mar. 26, 2014  (JP) .................. 2014-063499

(51) Int. Cl.
*H05K 1/14*  (2006.01)
*H05K 1/02*  (2006.01)
(Continued)

(52) U.S. Cl.
CPC ............. *H05K 1/14* (2013.01); *H01B 7/0861* (2013.01); *H05K 1/0237* (2013.01); *H05K 1/147* (2013.01);
(Continued)

(58) Field of Classification Search
CPC .......... H05K 1/14; H05K 1/147; H05K 1/028; H05K 3/361
See application file for complete search history.

(56) References Cited

U.S. PATENT DOCUMENTS 6,225,688 B1 *  5/2001  Kim .................... H01L 23/5387
                                                                257/686
6,417,455 B1 *  7/2002  Zein .................... H01B 7/0869
                                                                174/117 F
(Continued)

FOREIGN PATENT DOCUMENTS

CN          1659810 A     8/2005
CN       201585201 U     9/2010
(Continued)

OTHER PUBLICATIONS

The Extended European Search Report dated Mar. 1, 2017 for the related European Patent Application No. 15768610.6, 8 pages.
(Continued)

*Primary Examiner* — Nathan Milakovich
(74) *Attorney, Agent, or Firm* — McDermott Will & Emery LLP

(57) ABSTRACT

An electronic device includes: a first circuit board on which a first circuit is mounted; a second circuit board on which a second circuit is mounted; a supporter; a flexible flat cable disposed on the supporter and connecting the first circuit board and the second circuit board to each other, the flexible flat cable transmitting signals between the first circuit and the second circuit. The flexible flat cable is provided with a crease. The flexible flat cable is disposed such that the crease is in contact with the supporter.

16 Claims, 6 Drawing Sheets

(51) Int. Cl.
  *H05K 9/00* (2006.01)
  *H05K 3/36* (2006.01)
  *H01B 7/08* (2006.01)
  *H05K 3/00* (2006.01)

(52) U.S. Cl.
  CPC ........... *H05K 9/0088* (2013.01); *H05K 1/028* (2013.01); *H05K 1/0283* (2013.01); *H05K 3/0058* (2013.01); *H05K 3/361* (2013.01); *H05K 2201/055* (2013.01); *H05K 2201/10128* (2013.01)

(56) References Cited

U.S. PATENT DOCUMENTS

| | | | | |
|---|---|---|---|---|
| 6,603,077 | B2* | 8/2003 | Hirai | H01R 24/44 174/78 |
| 7,672,142 | B2* | 3/2010 | Wang | G06F 1/189 174/262 |
| 8,003,887 | B1* | 8/2011 | Hsieh | H02G 11/006 174/69 |
| 8,215,967 | B2* | 7/2012 | Hsieh | H01R 31/06 174/69 |
| 9,214,779 | B2* | 12/2015 | Bieletzki-Welz | H01R 12/73 |
| 9,554,461 | B2* | 1/2017 | Kato | H04M 1/026 |
| 9,631,801 | B2* | 4/2017 | Que | H01R 12/88 |
| 2002/0179313 | A1 | 12/2002 | Hirai | |
| 2003/0222282 | A1 | 12/2003 | Fjelstad et al. | |
| 2005/0289575 | A1* | 12/2005 | Makara | G11B 33/122 720/652 |
| 2010/0283777 | A1 | 11/2010 | Sang et al. | |
| 2011/0134592 | A1* | 6/2011 | Mikami | H04M 1/0237 361/679.01 |
| 2012/0230000 | A1* | 9/2012 | Ishino | H05K 1/0281 361/803 |
| 2017/0238437 | A1* | 8/2017 | Ishida | G02F 1/13306 361/800 |

FOREIGN PATENT DOCUMENTS

| | | | |
|---|---|---|---|
| JP | 52-089688 U | | 7/1977 |
| JP | 53-154385 U | | 12/1978 |
| JP | 57-177325 U | | 11/1982 |
| JP | 63-029817 U | | 2/1988 |
| JP | 2-108213 U | | 8/1990 |
| JP | 4-039011 | | 2/1992 |
| JP | 7-028105 B | | 3/1995 |
| JP | 2006060940 A | * | 3/2006 |
| JP | 2006-140221 A | | 6/2006 |
| JP | 2007-311709 | | 11/2007 |
| JP | 2008-060045 A | | 3/2008 |
| JP | 2011030032 A | * | 2/2011 |
| JP | 2014-030172 | | 2/2014 |
| JP | 2015-185623 A | | 10/2015 |

OTHER PUBLICATIONS

International Search Report of PCT application No. PCT/JP2015/000987 dated Jun. 2, 2015, 4 pages.
English Translation of Chinese Search Report dated Feb. 12, 2018 for the related Chinese Patent Application No. 201580004044.4.
Communication pursuant to Article 94(3) EPC dated Jun. 17, 2019 for the related European Patent Application No. 15768610.6.

* cited by examiner

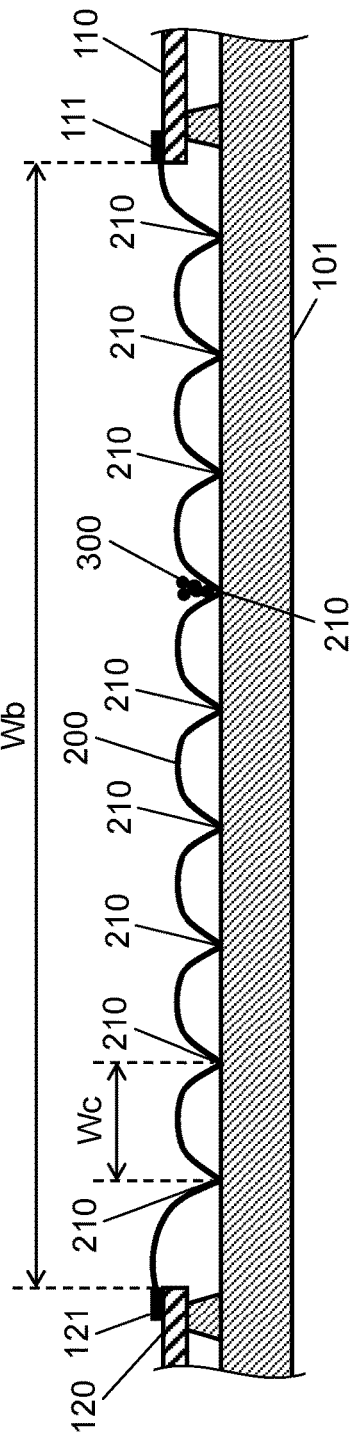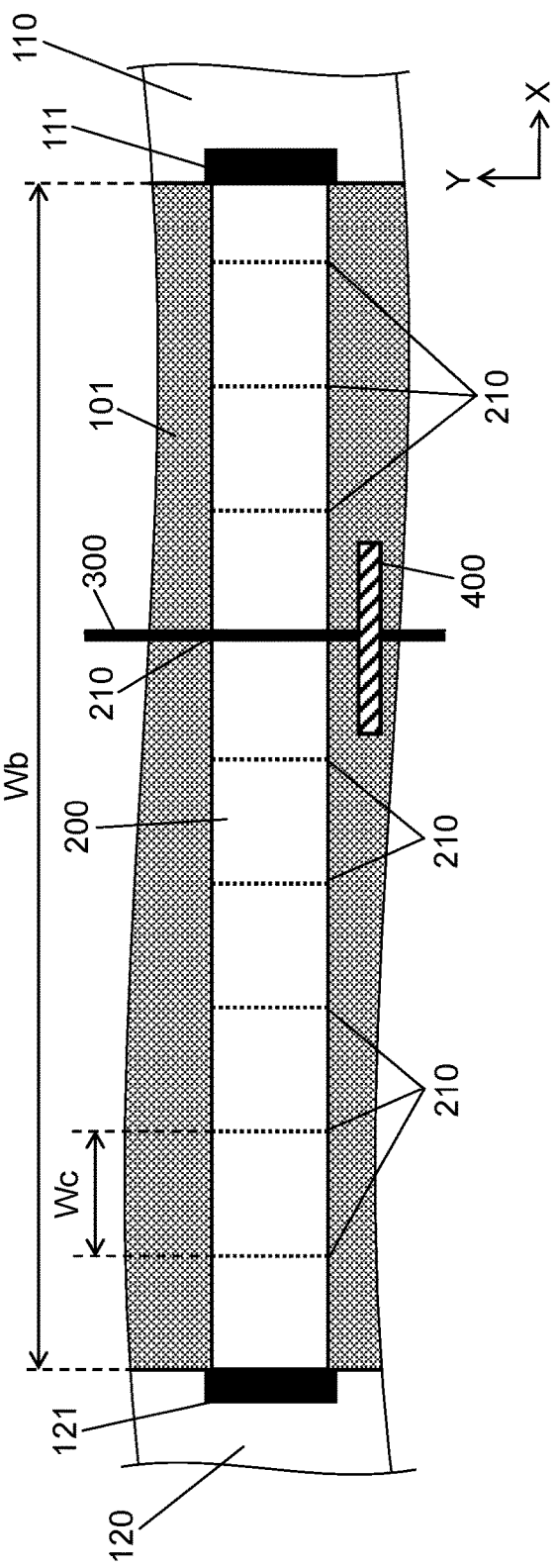

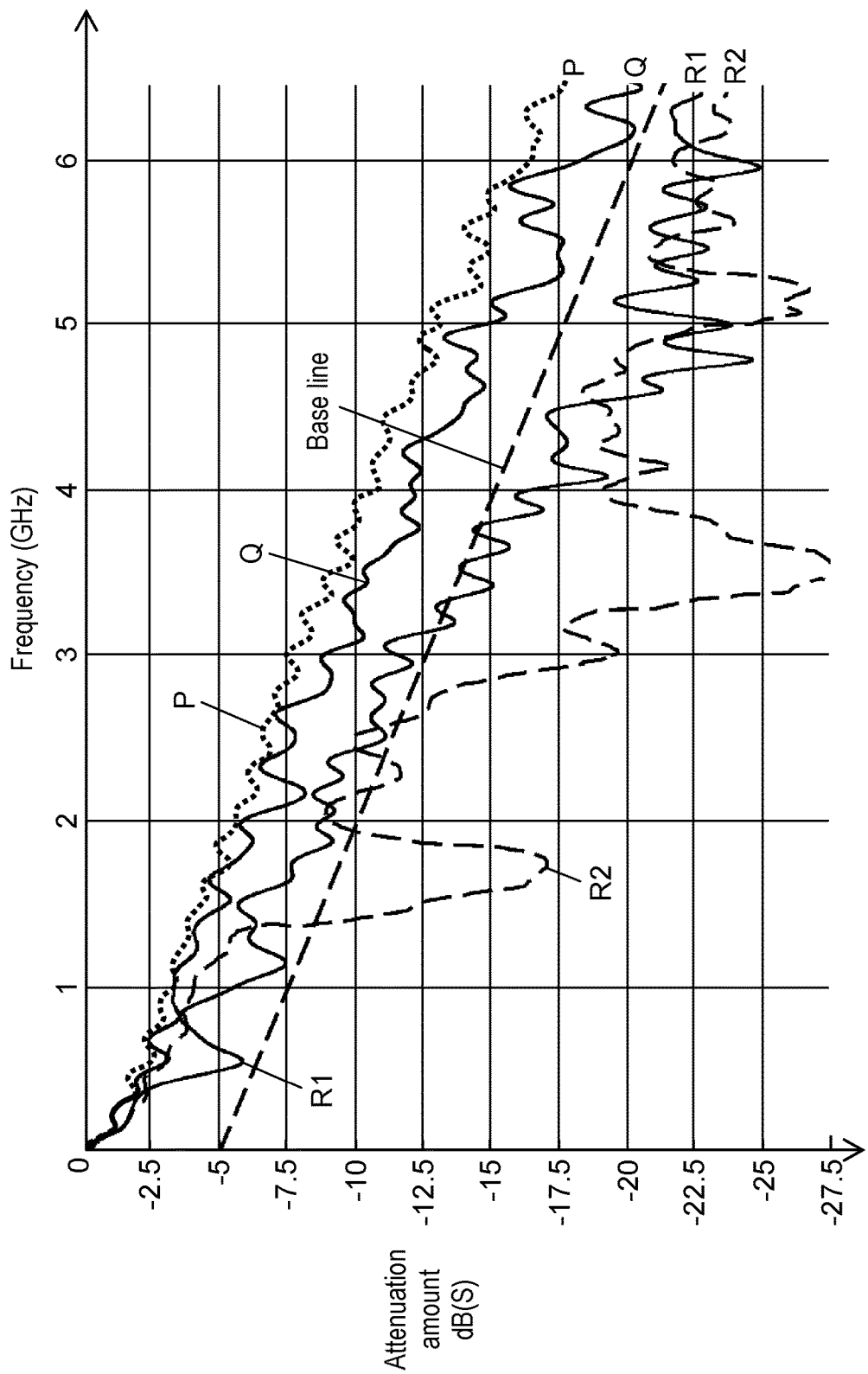

ELECTRONIC DEVICE AND DISPLAY UNIT

TECHNICAL FIELD

The present disclosure relates to an electronic device in which a plurality of circuit boards are electrically connected to each other by a flexible flat cable.

BACKGROUND ART

Patent Literature 1 discloses a technique relating to a flexible flat cable (hereinafter abbreviated as an "FFC").

In an electronic device in which two circuit boards are electrically connected to each other by an FFC, a differential data transmission scheme may be used in a case where signals of a great information volume, such as video signals, are transmitted.

One representative scheme belonging to the differential data transmission scheme is the LVDS (Low Voltage Differential Signaling). The LVDS is a technique that realizes high-speed digital interface, and used, for example, in a case where video signals are transmitted between circuit boards in a display apparatus. The transmission rate of the LVDS is several hundred Mbps per channel.

In recent years, display panels of higher resolution are available. For example, there is a display panel having about 4000×2000 pixels (hereinafter referred to as a "4k2k panel"). With a display apparatus having such a high-resolution display panel, the information volume of an image is greater than with a conventional display apparatus, and therefore the transmission volume of video signals becomes greater than with the conventional display apparatus. Accordingly, with such a display apparatus, even when the LVDS is used for transmitting video signals, it is difficult to suppress an increase in the number of signals (i.e., the number of channels) required to be transmitted. Then, when the number of signal lines (i.e., the number of channels) included in one FFC is increased in order to address the increase in the number of signals, various restrictions and difficulties may arise in designing circuit boards.

When the signal transmission volume per channel can be increased, the number of signal lines (i.e., the number of channels) included in one FFC can be reduced. Here, transmission schemes that realize the transmission volume per channel at gigabit rates (Gpbs) are proposed as techniques replacing the LVDS. The transmission schemes include, for example, the V-BY-One (registered trademark) HS providing the maximum transmission rate of 3.75 Gbps, and the eDP (embedded Display Port) providing the maximum transmission rate of 5.4 Gbps.

As a cable for transmitting high frequency signals based on such transmission schemes between circuit boards, generally, an FFC which is impedance-matched and capable of keeping the quality of the transmission signals is used. Such an FFC is generally structured as follows. A wiring conductor through which signals flow is covered by an insulator. On one surface (a shield surface) of the wiring conductor, a dielectric, a conductor metal foil for GND and an insulator are layered in order to prevent leakage or entry of electromagnetic noises. In the following, the one surface (the shield surface) of an FFC is referred to as the "shield surface of the FFC", and the other surface thereof is referred to as the "signal surface of the FFC".

With an electronic device having circuit boards connected to each other by the FFC, in some cases, when the signal surface of the FFC is brought into surface contact with a metal-made member (a metal material), a low-pass filter (LPF) may be formed by the capacitance occurring at the contact portion and the resistance component of the wire resistance and the like. This LPF may attenuate high frequency signals flowing through the FFC. This capacitance becomes greater in proportional to the contact area between the signal surface of the FFC and the metal material. As the capacitance is greater, the attenuation amount of the high frequency signals flowing through the FFC tends to increase.

For example, with a display apparatus including a liquid crystal panel as a display panel, circuit boards are generally disposed on a metal material (a supporter that supports the display unit of the liquid crystal panel) covering the back surface side of the liquid crystal panel. In order to prevent leakage or entry of electromagnetic noises, an FFC is disposed such that the shield surface is opposed to the rear cover of the display apparatus. Accordingly, when a "sag" or the like occurs at the FFC, the signal surface of the FFC may be brought into surface contact with the metal material.

Then, with an electronic device in which high frequency signals are transmitted and received between internal circuit boards at gigabit rates, when the metal material and the signal surface of an FFC are brought into surface contact with each other, the signals transmitted through the FFC attenuate, and the circuit board on the reception side may not be able to normally receive the signals.

CITATION LIST

Patent Literature

PTL 1: Unexamined Japanese Patent Publication No. 2007-311709

SUMMARY

The present disclosure provides an electronic device and a display apparatus capable of reducing the attenuation amount of high frequency signals transmitted and received between a plurality of circuit boards, when the frequency signals are transmitted through an FFC.

An electronic device of the present disclosure includes: a first circuit board on which a first circuit is mounted; a second circuit board on which a second circuit is mounted; a supporter; and a flexible flat cable. The flexible flat cable is disposed on the supporter and connects the first circuit board and the second circuit board to each other. The flexible flat cable transmits a signal between the first circuit and the second circuit. The flexible flat cable is provided with a crease. The flexible flat cable is disposed such that the crease is in contact with the supporter.

A display apparatus of the present disclosure includes: a display panel having a display unit displaying an image and a supporter supporting the display unit; a first circuit board on which a first circuit is mounted; a second circuit board on which a second circuit is mounted; and a flexible flat cable. The flexible flat cable is disposed on the supporter, and connects the first circuit board and the second circuit board to each other. The flexible flat cable transmits a signal between the first circuit and the second circuit. The flexible flat cable is provided with a crease. The flexible flat cable is disposed such that the crease is in contact with the supporter.

BRIEF DESCRIPTION OF DRAWINGS

FIG. 5A is a cross-sectional view taken along line A-A in FIG. 1.

FIG. 5B is a plan view of a portion around the flexible flat cable of a display apparatus according to the first exemplary embodiment in a partially enlarged manner.

FIG. 6 is a diagram showing the relationship between the frequency of signals flowing through the flexible flat cable disposed in the display apparatus according to the first exemplary embodiment and the attenuation amount.

DESCRIPTION OF EMBODIMENTS

In the following, with reference to the drawings as appropriate, a description will be given of an exemplary embodiment in detail. However, an unnecessarily detailed description may be omitted. For example, a detailed description of an already well-known matter or a repeated description of a substantially identical structure may be omitted. This is to avoid the following description from becoming unnecessary redundant, and to facilitate understanding of a person skilled in the art.

Note that, the accompanying drawings and the following description are provided for a person skilled in the art to fully understand the present disclosure, and they are not intended to limit the subject matter stated in the scope of claims.

First Exemplary Embodiment

In the following, with reference to FIGS. 1 to 6, a description will be given of a first exemplary embodiment. Note that, in the present exemplary embodiment, though a display apparatus including a liquid crystal panel as a display panel is shown as an example of an electronic device including an FFC, the present disclosure is not limited to the display apparatus. The present disclosure is applicable to an electronic device in which a plurality of circuit boards are connected to each other by an FFC, and high frequency signals which are transmitted and received between the circuit boards are transmitted via the FFC.

[1-1. Structure]

Figure 1:
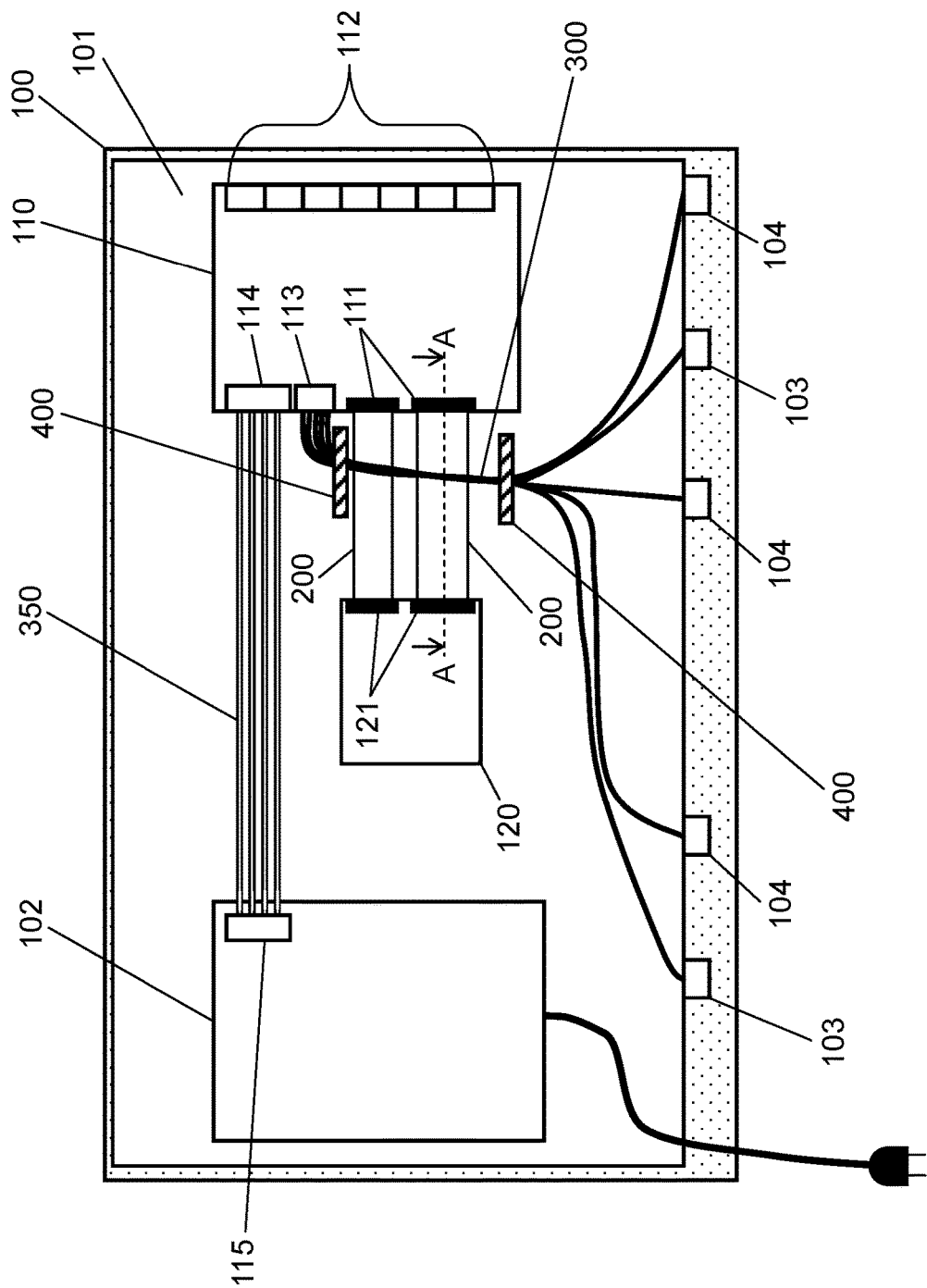
FIG. 1 is a rear view of a display apparatus according to a first exemplary embodiment.

FIG. 1 is a rear view of display apparatus 100 according to the first exemplary embodiment. FIG. 1 schematically shows a plan view of display apparatus 100 from which a rear cover is removed as seen from the back surface side. Note that, in the present exemplary embodiment, in display apparatus 100, the side where a surface for displaying images is provided (the image display side) is the front, and the side opposite to the image display surface (on the rear cover side) is the back.

Display apparatus 100 includes a display panel, signal circuit board 110, timing controller board (hereinafter referred to as "TCon board") 120, power supply circuit board 102, a plurality of speakers 103 outputting sounds, a plurality of module units 104, and FFCs 200.

The display panel includes a display unit having two glass substrates between which a plurality of display elements for displaying images are formed, and chassis unit 101 supporting the display unit (the glass substrates). Chassis unit 101 is one example of a supporter. The glass substrates are disposed on the front side of display apparatus 100, and chassis unit 101 is disposed on the back side of display apparatus 100. Accordingly, in FIG. 1, chassis unit 101 of the display panel is shown and the display unit is not shown. Though chassis unit 101 is formed by metal such as aluminum for example, chassis unit 101 may be formed by other materials.

Signal circuit board 110 is a circuit board on which a signal processing circuit (not shown) that processes signals (input video signals and the like) received from an external video signal generating apparatus, a broadcast station or the like and outputs the processed signals is mounted. The signal processing circuit is one example of a first circuit, and signal circuit board 110 is one example of a first circuit board.

TCon board 120 is a circuit board on which a drive circuit (not shown) is mounted. The drive circuit receives video signals output from the signal processing circuit mounted on signal circuit board 110, and generates signals for displaying an image based on the video signals on the display unit of the display panel. The drive circuit is one example of a second circuit, and TCon board 120 is one example of a second circuit board.

Power supply circuit board 102 is a circuit board on which a power supply circuit (not shown) that converts AC household power supply into DC power supply is mounted. In display apparatus 100, the circuit boards, i.e., signal circuit board 110, TCon board 120, and power supply circuit board 102 are disposed on chassis unit 101. With display apparatus 100, though the circuit boards are fixed to chassis unit 101, the present exemplary embodiment does not limit the arrangement position or fixing method of the circuit boards. The circuit boards may be fixed to any member other than the supporter (for example, a housing or the like), or may not be disposed immediately above chassis unit 101.

Module units 104 are, for example, a light receiving unit that receives infrared signals from a remote controller, a Wi-Fi (registered trademark) connecting unit, a Bluetooth (registered trademark) connecting unit and the like. However, module units 104 are not limited thereto.

Between speakers 103 and signal circuit board 110, and between module units 104 and signal circuit board 110, are electrically connected by wire harnesses 300.

FFCs 200 are disposed on chassis unit 101 to connect signal circuit board 110 and TCon board 120 to each other, thereby transmitting high frequency signals between the signal processing circuit and the drive circuit.

Signal circuit board 110 has terminal group 112. Terminal group 112 is made up of, for example, an HDMI (registered trademark) terminal, a USB (Universal Serial Bus) terminal, a YUV terminal, a tuner and the like. However, the present disclosure is not limited thereto. Mounted on signal circuit board 110 is an LSI (Large Scale Integrated circuit, not shown) in which a signal processing circuit configured to perform signal processing such as demodulation of video signals and sound signals input from terminal group 112 or a noise removing process is integrated.

The signal processing circuit mounted on the signal circuit board 110 is configured to convert input video signals into video signals suitable for the display unit of the display panel, and to output the converted video signals (digital video signals). The signal processing circuit provides various signal processes to input video signals based on the drive scheme of the display unit of the display panel, the number of pixels and the like. Further, the signal processing circuit is also configured to control speakers 103 and module units 104.

Note that, in place of the signal processing circuit, a processor may be mounted on signal circuit board 110, to cause the processor to execute a program created to realize operations similar to those of the signal processing circuit.

Mounted on TCon board 120 is an IC (Integrated Circuit, not shown) in which a drive circuit configured to receive digital video signals output from the signal processing circuit on signal circuit board 110 and to convert the video signals into signals conforming to the specification of the display unit of the display panel is integrated. The drive circuit mounted on TCon board 120 is configured to receive video signals output from the signal processing circuit mounted on signal circuit board 110, and to convert the video signals into a format suitable for the display unit of the display panel and output the converted signals at proper timing, in order for an image based on the video signals to be displayed on the display unit of the display panel. Then, in order for an image based on the video signals output from the signal processing circuit to be displayed on the display unit of the display panel, the drive circuit outputs signals for driving the display elements (liquid crystal cells) of the display unit based on the video signals.

Note that, in place of the drive circuit, a processor may be mounted on TCon board 120, to cause the processor to execute a program created to realize operations similar to those of the drive circuit.

Signal circuit board 110 and TCon board 120 are electrically connected to each other by two FFCs 200. On signal circuit board 110, two receptacle connectors 111 for electrically connecting FFCs 200 to the signal processing circuit on the signal circuit board 110 are provided. Further, on TCon board 120 also, two receptacle connectors 121 for electrically connecting FFCs 200 to the drive circuit on TCon board 120 are provided. In the following, the receptacle connectors are simply referred to as the "connectors".

To connectors 111, one ends of FFCs 200 are connected. To connectors 121, the other ends of FFCs 200 are connected. Thus, the signal processing circuit on signal circuit board 110 and the drive circuit on TCon board 120 are electrically connected to each other. Between the signal processing circuit on signal circuit board 110 and the drive circuit on TCon board 120, high-frequency digital video signals are exchanged at high-speed (for example, at gigabit rates) via FFCs 200.

Note that, the number of FFCs 200 connecting between the signal circuit board 110 and TCon board 120 is not limited to two. The number of FFCs 200 may be one or three or more.

Signal circuit board 110 has connector 113 that electrically connects wire harnesses 300 to the signal processing circuit. Wire harnesses 300 having their one ends connected to connector 113 and their other ends connected to module units 104 or speakers 103 transmit signals between the signal processing circuit on signal circuit board 110 and module units 104 or speakers 103. Wire harnesses 300 are disposed such that FFCs 200 are interposed between wire harnesses 300 and chassis unit 101 of the display panel. Accordingly, as shown in FIG. 1, wire harnesses 300 cross FFCs 200. Since wire harnesses 300 are relatively long and different from one another in length, they tend to be spread. Therefore, at display apparatus 100, in order to prevent wire harnesses 300 from spreading, wire harnesses 300 are gathered and fixed to chassis unit 101 of the display panel by adhesive tapes 400. In display apparatus 100, FFCs 200 are pressed against chassis unit 101 by wire harnesses 300 fixed to chassis unit 101 by adhesive tapes 400.

Signal circuit board 110 has connector 114 for connecting cables 350. Power supply circuit board 102 has connector 115 for connecting cables 350. By cables 350 having their one ends connected to connector 114 and their other ends connected to connector 115, power supply and ground potential on signal circuit board 110 are electrically connected to power supply and ground potential of the power supply circuit on power supply circuit board 102, respectively. Thus, from the power supply circuit on power supply circuit board 102, properly set voltage is supplied to the signal processing circuit on signal circuit board 110.

Note that, since operations of circuits included in display apparatus 100 are substantially the same as those of a generally used display apparatus of a liquid crystal television set or the like, detailed description thereof is omitted.

Next, FFCs 200 will be described.

Figure 2:
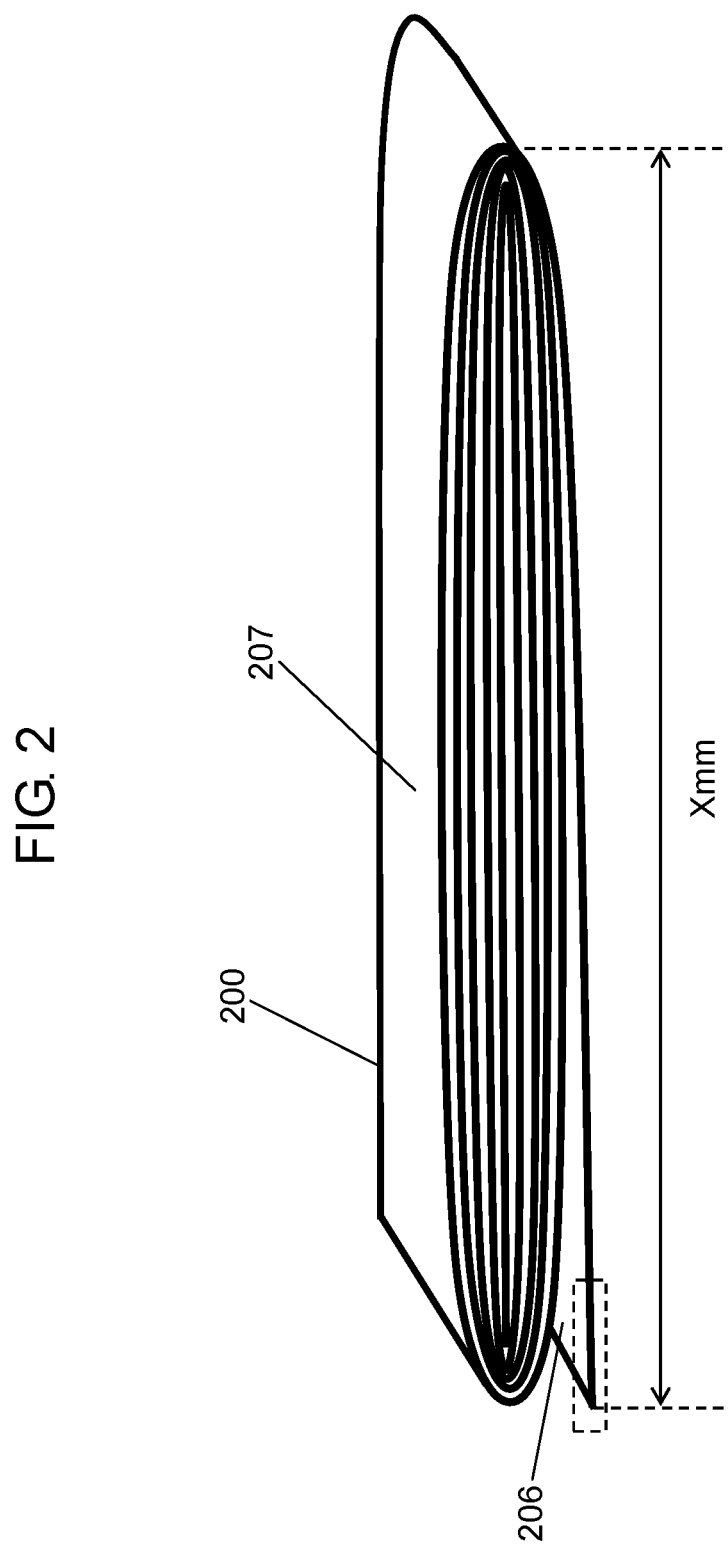
FIG. 2 is a schematic diagram of a flexible flat cable according to the first exemplary embodiment.

FIG. 2 is a schematic diagram of FFC 200 according to the first exemplary embodiment. FIG. 2 shows one example of FFC 200 before being connected to connector 111 of signal circuit board 110 and connector 121 of TCon board 120.

FFC 200 has a front surface and a back surface. In the present exemplary embodiment, the front surface of FFC 200 is shield surface 206, and the back surface is signal surface 207. FFC 200 is formed to have certain flexibility and durability withstanding repeated folding. Therefore, FFC 200 can keep the state folded into any shape. For example, FFC 200 can keep creases provided to FFC 200. The creases will be described later.

FIG. 2 shows, as one example, FFC 200 being repeatedly folded by a length of about X mm (millimeters, for example, about 50 mm). Since FFC 200 can keep such a folded state, a volume required for storage or transportation, for example, can be reduced.

Figure 3:
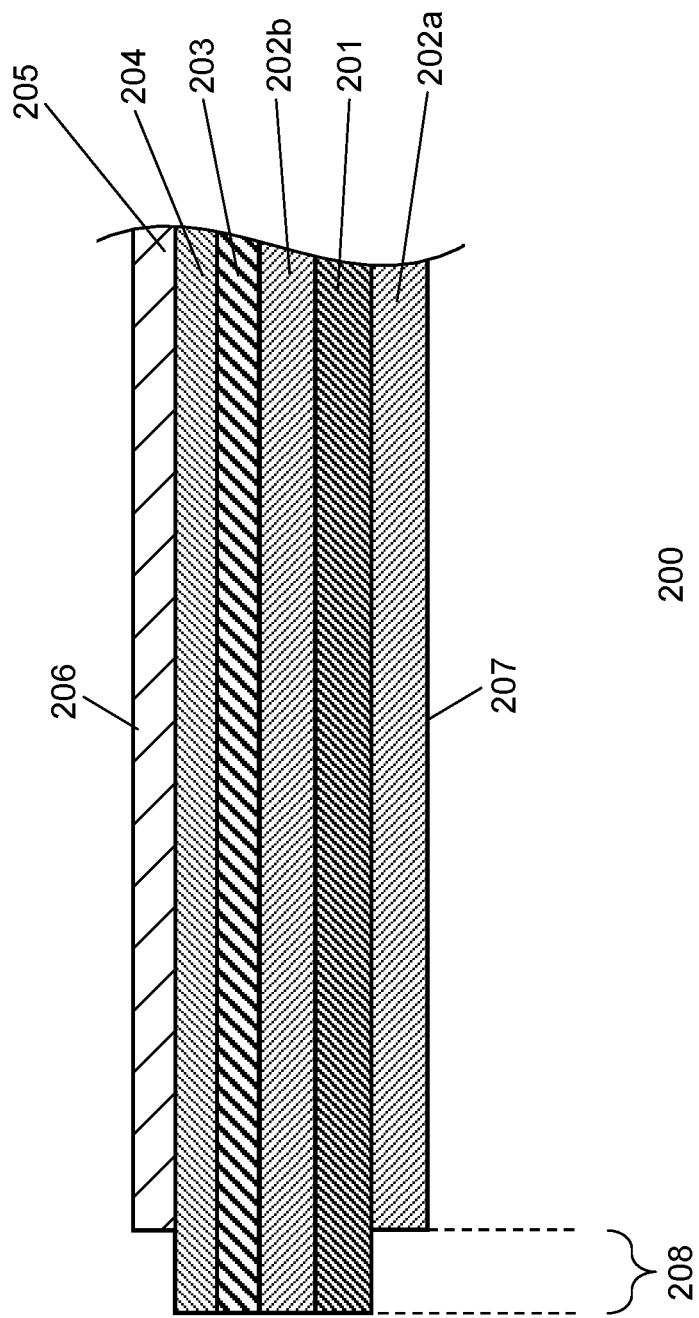
FIG. 3 is a partial enlarged view of the cross section of an end of the flexible flat cable according to the first exemplary embodiment.

FIG. 3 is a partial enlarged view of the cross section of an end of FFC 200 according to the first exemplary embodiment. FIG. 3 shows a partial cross-sectional view of the area indicated by a broken line in FIG. 2.

FFC 200 according to the present exemplary embodiment is formed by a plurality of stacked substance layers, and has a thickness of about 0.5 mm to 1 mm. For example as shown in FIG. 2, FFC 200 is structured by six layers of insulating coat 202a, conductor 201, insulating coat 202b, dielectric 203, conductor 204, and insulator 205 being stacked in order from the back surface (signal surface 207). Accordingly, one surface of insulating coat 202a is exposed outside as the back surface (signal surface 207), and one surface of insulator 205 is exposed outside as the front surface (shield surface 206). Insulating coat 202a, insulating coat 202b, and insulator 205 are formed by materials exhibiting relatively high insulation, such as synthetic resin.

Conductor 201 is a transmission path of signals, and is formed by a material exhibiting relatively high conductivity such as copper, so as to be capable of transmitting high frequency signals. Signals transmitted between signal circuit board 110 and TCon board 120 (for example, high-frequency digital video signals and the like) pass through this conductor 201. Note that, conductor 201 is divided into a plurality of lines, and FFC 200 is capable of passing signals corresponding to the number of the lines. In display apparatus 100 according to the present exemplary embodiment, two FFCs 200 respectively having 51 and 41 pieces of conductors 201 are employed. However, the number of lines of conductor 201 is not limited to such values.

The other surface of insulating coat 202a is in intimate contact with one surface of conductor 201, and the other surface of conductor 201 is in intimate contact with one surface of insulating coat 202b. Thus, the opposite surfaces of conductor 201 are respectively covered by insulating coat 202a and insulating coat 202b exhibiting relatively high insulating performance.

One surface of dielectric 203 is in intimate contact with the other surface of insulating coat 202b. One surface of conductor 204 is in intimate contact with the other surface of dielectric 203. Conductor 204 is formed by a material exhibiting relatively high conductivity such as copper, and connected to ground potential (the ground line, hereinafter also referred to as "GND"). Then, the other surface of conductor 204 is in intimate contact with the other surface of insulator 205.

Note that, ends 208 of FFC 200 are not covered by insulating coat 202a and insulator 205 so as to be capable of being electrically connected to connectors 111 and 121, and the regions where conductor 201, insulating coat 202b, dielectric 203, and conductor 204 are stacked are exposed. By one end 208 being connected to connector 111 and the other end 208 being connected to connector 121, conductor 201 and connector 111 as well as connector 121 are electrically connected, and conductor 204 and connector 111 as well as connector 121 are electrically connected. Thus, the ground potential of signal circuit board 110 and the ground potential of TCon board 120 become substantially identical, and signals can be transmitted and received between the signal processing circuit on signal circuit board 110 and the drive circuit on TCon board 120.

In FFC 200, the materials and thickness of dielectric 203 and (or) conductor 204 are adjusted, to match the impedance of conductor 201 and conductor 204 to 100 Ω(ohm). Note that, FFC 200 is not limited to the six-layer structure, and the thickness and the impedance are not limited to the above-noted values.

In the present exemplary embodiment, since FFC 200 has the above-described structure, shield surface 206 and signal surface 207 differ in the performance of shielding the electromagnetic noises (the performance of preventing leakage and entry of electromagnetic noises) from each other. The distance from shield surface 206 to conductor 201 being the transmission path of signals is greater than the distance from signal surface 207 to conductor 201. Further, between conductor 201 and shield surface 206, a plurality of physical layers including conductor 204 connected to the ground potential are interposed. This conductor 204 functions as a shield layer that shields electromagnetic waves. On the other hand, between conductor 201 and signal surface 207, only insulating coat 202a is present. Therefore, shield surface 206 is greater in the electromagnetic noise shielding performance than signal surface 207.

With display apparatus 100 according to the present exemplary embodiment, FFC 200 is disposed such that shield surface 206 is positioned on the back surface side of the display apparatus 100 and such that signal surface 207 is positioned on the chassis unit 101 side of the display panel. This is to prevent the electromagnetic noises generated by high frequency signals passing through FFC 200 from leaking outside display apparatus 100.

Figure 4A:
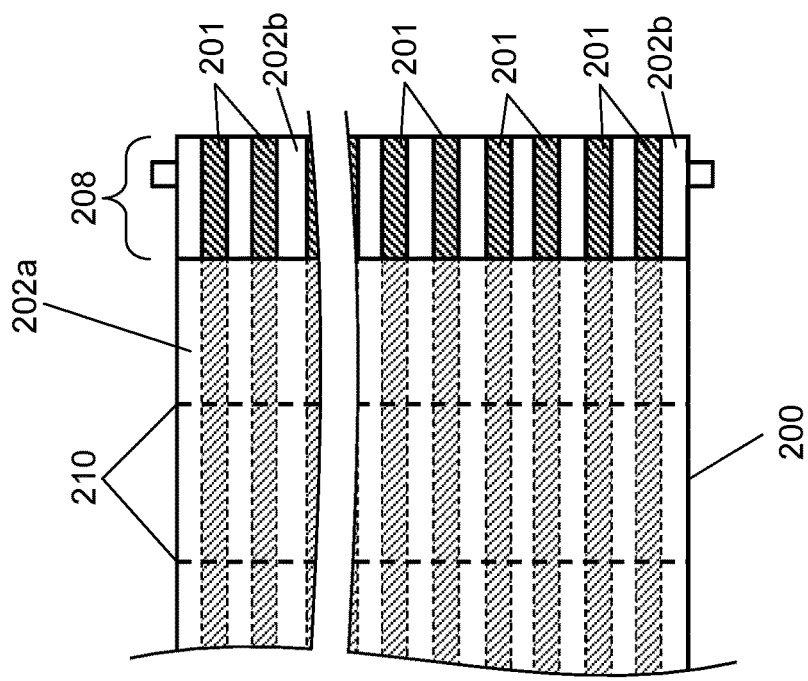
FIG. 4A is a plan view of an end of the flexible flat cable according to the first exemplary embodiment as seen from a signal surface side.

FIG. 4A is a plan view of ends 208 of FFC 200 according to the first exemplary embodiment as seen from the signal surface 207 side. In FIG. 4A, part of FFC 200 is omitted. Further, in FIG. 4A, conductor 201 routed under insulating coat 202a is represented by broken lines.

As described above, with display apparatus 100, two FFCs 200 differing in the number of lines of conductor 201 (for example, 51 pieces and 41 pieces) from each other are used. FFC 200 is shaped such that its one end 208 can be connected to connector 111 and the other end 208 can be connected to connector 121. Then, as described above, at ends 208 of FFC 200, conductor 201 is not covered by insulating coat 202a, and conductor 204 is not covered by insulator 205. Accordingly, as shown in FIG. 4A, conductor 201 and insulating coat 202b are alternately exposed on signal surface 207 at ends 208. The regions where insulating coat 202b is exposed are portions where conductor 201 is not provided.

FFC 200 according to the present exemplary embodiment is provided with a plurality of creases 210. Creases 210 are formed to be valley-folded on the shield surface 206 side and mountain-folded on the signal surface 207 side. Accordingly, in FFC 200 provided in display apparatus 100, a region projecting in an arc-shaped manner toward the shield surface 206 side (the rear cover side of display apparatus 100) between crease 210 and crease 210 is produced. In the present exemplary embodiment, nine creases 210 are provided to FFC 200 at an interval (represented by "Wa" in FIG. 4A) of about 50 mm to 70 mm.

Figure 4B:
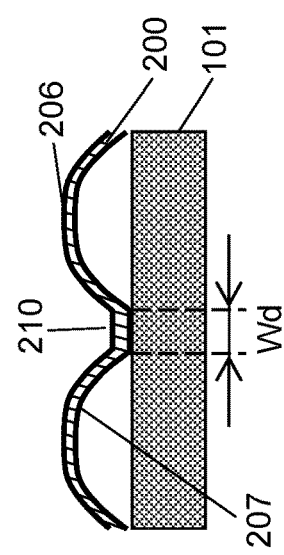
FIG. 4B is a cross-sectional view showing a crease of the flexible flat cable according to the first exemplary embodiment in an enlarged manner.

FIG. 4B is a cross-sectional view showing crease 210 of FFC 200 according to the first exemplary embodiment in a partially enlarged manner. Note that, FIG. 4B shows chassis unit 101 of the display panel, and does not show the display unit.

As shown in FIG. 4B, crease 210 is provided with a fold-back which is set to have a width of about 5 mm to 40 mm (represented by "Wd" in FIG. 4B). In the present exemplary embodiment, FFC 200 is disposed at display apparatus 100 such that the folded back portion (the portion of signal surface 207 being mountain-folded) of crease 210 is in contact with chassis unit 101 of the display panel.

Note that, the number of creases 210 provided to FFC 200, an interval of creases 210, and a width of the fold-back described above are merely an example, and the present disclosure is not limited to the above-described values. The number of creases 210 provided to FFC 200, an interval of creases 210, a width of the fold-back and the like are desirably appropriately set according to the specification or size of an electronic device (or a display apparatus) in which FFC 200 is used, and the material or size of FFC 200 and the like.

Note that, the area of signal surface 207 of FFC 200 being in contact with chassis unit 101 of the display panel formed by metal is desirably the smallest as possible. Accordingly, the number of creases 210 provided to FFC 200 is preferably smaller, and the width of the fold-back is preferably also smaller.

FIG. 5A is a cross-sectional view taken along line A-A in FIG. 1. FIG. 5B is a plan view of a portion around FFC 200 of display apparatus 100 according to the first exemplary embodiment in a partially enlarged manner. FIGS. 5A and 5B are a cross-sectional view and a plan view showing the state where FFC 200 is connected to signal circuit board 110 and TCon board 120. FIG. 5A shows chassis unit 101 of the display panel, and does not show the display unit.

Note that, in FIGS. 5A and 5B, the spaced-apart distance between signal circuit board 110 and TCon board 120 is represented by "Wb".

As shown in FIGS. 5A and 5B, FFC 200 electrically connecting between signal circuit board 110 and TCon board 120 is disposed on chassis unit 101 of the display panel. The length of FFC 200 is set to be longer than spaced-apart distance Wb between signal circuit board 110 and TCon board 120. Accordingly, to FFC 200 having its ends 208 respectively connected to signal circuit board 110 and TCon board 120, stress toward the center from both ends 208 is applied by the elastic force of FFC 200. This stress serves as force pressing creases 210 of FFC 200 against chassis unit 101 of the display panel.

Thus, creases 210 of FFC 200 are pressed against chassis unit 101 of the display panel. FFC 200 is in contact with chassis unit 101 of the display panel, with the fold-backs of creases 210 being at interval We which is shorter than interval Wa between creases 210. That is, FFC 200 is disposed such that interval We of contact portions of the fold-backs of creases 210 and chassis unit 101 becomes shorter than interval Wa between adjacent creases 210. Thus, between crease 210 and crease 210, by the elastic force of FFC 200, a region projecting in an arc-shaped manner toward the back surface side originating from crease 210 being in contact with chassis unit 101 is formed (i.e., shield surface 206 is convex-shaped).

For example, it is assumed that the FFC electrically connecting signal circuit board 110 and TCon board 120 is set to have a length substantially equal to spaced-apart distance Wb between connector 111 and connector 121 without having any creases 210. With this structure, the FFC is less likely to be brought into contact with chassis unit 101 of the display panel and hence ideal. However, actually, during manufacture of the FFC, the length of the FFC may be varied, and the FFC being shorter than spaced-apart distance Wb between connector 111 and connector 121 may be manufactured. Such an FFC cannot be used for display apparatus 100. In order to prevent an occurrence of such a problem, the FFC must be longer than spaced-apart distance Wb between connector 111 and connector 121. However, when signal circuit board 110 and TCon board 120 are electrically connected to each other by the FFC being simply greater in length and having no creases 210, a "sag" may occur. Then, unexpected surface contact may occur between the FFC and chassis unit 101 of the display panel.

In the present exemplary embodiment, FFC 200 is set to be longer than spaced-apart distance Wb, and to be provided with creases 210. Thus, it becomes possible to avoid the problem that a short FFC that cannot electrically connect between the connectors is manufactured because of variations during manufacture. Further, when signal circuit board 110 and TCon board 120 are electrically connected to each other by FFC 200, by the elastic force of FFC 200, the force pressing creases 210 against chassis unit 101 of the display panel can be produced at FFC 200. Thus, at FFC 200, the region projecting in an arc-shaped manner toward the back surface side originating from creases 210 is formed between crease 210 and crease 210, and the fold-back of crease 210 is pressed against chassis unit 101 of the display panel. Accordingly, with display apparatus 100, by being supported by creases 210, FFC 200 can be kept in a stable state on chassis unit 101 of the display panel.

In the present exemplary embodiment, furthermore, as shown in FIG. 5B, wire harness 300 is disposed at the position of crease 210 of FFC 200, whereby crease 210 is clamped between chassis unit 101 of the display panel and wire harness 300. In order to keep this state, wire harness 300 may be fixed to chassis unit 101 by adhesive tape 400 or the like. Thus, to FFC 200, the force pressing crease 210 against chassis unit 101 of the display panel is applied by wire harness 300, and crease 210 of FFC 200 is prevented from floating upward from chassis unit 101. Accordingly, FFC 200 can be kept on chassis unit 101 in more stable state.

[1-2. Operation]

In connection with display apparatus 100 structured as described above, the relationship between the frequency of signals transmitted through FFC 200 and the attenuation amount will be described.

FIG. 6 is a diagram showing the relationship between the frequency of signals flowing through FFC 200 provided to display apparatus 100 according to the first exemplary embodiment and the attenuation amount. In FIG. 6, the horizontal axis indicates the frequency of signals (GHz). The vertical axis indicates the attenuation amount of signals (dB), and shows that as the position is lower (as the negative value is greater), the attenuation amount is greater.

Note that, the graphs shown in FIG. 6 are a collection of results of experiments in which signal circuit board 110 and TCon board 120 are electrically connected to each other with FFC 200 having a length of about 400 mm, and the amplitude ratio between input signals and output signals is measured while varying the frequency of the signals transmitted through FFC 200. Further, FIG. 6 shows graphs Q, R1, and R2 for comparison with graph P representing the experimental result based on the structure according to the present exemplary embodiment.

In FIG. 6, graph P is a graph showing the relationship between the frequency of signals flowing through FFC 200 and the attenuation amount, in the case where five creases 210 are provided to FFC 200 at an interval of about 50 mm, with fold-back width Wd of each crease 210 being set to several mm (about 5 mm), and the five creases 210 are brought into contact with chassis unit 101 of the display panel with the structure similar to that described above.

Graph Q is a graph showing the relationship between the frequency of signals flowing through FFC 200 and the attenuation amount, in the case where no creases 210 are provided to FFC 200 and FFC 200 is fixed to chassis unit 101 of the display panel by adhesive tapes having a length of 40 mm at five sites at a certain interval. That is, with this structure, five discrete sites in FFC 200 (the total region: 5×40 mm=200 mm) are in contact with chassis unit 101 by the adhesive tapes.

Graph R1 is a graph showing the relationship between the frequency of signals flowing through FFC 200 and the attenuation amount, in the case where no creases 210 are provided to FFC 200 and FFC 200 is caused to have a "sag". Further, in FFC 200, a continuous region having a length of about 200 mm is brought into surface contact with chassis unit 101 of the display panel using the elastic force of FFC 200.

Graph R2 is a graph showing the relationship between the frequency of signals flowing through FFC 200 and the attenuation amount, in the case where no creases 210 are provided to FFC 200 and FFC 200 is fixed to chassis unit 101 of the display panel by an adhesive tape having a length of 200 mm.

The experiments relating to graphs Q, R1, and R2 are identical to one another in that a region of about 200 mm in FFC 200 is in contact with chassis unit 101 of the display panel.

Note that, in FIG. 6, a broken line represents the base line showing the lower limit of the attenuation amount that does not substantially influence the image displayed on the display unit of display apparatus 100. Accordingly, from the graphs of FIG. 6, it can be seen that, when the attenuation amount is greater than the base line (when a graph is positioned lower than the base line), the image displayed on the display unit may be influenced in any manner; and when the attenuation amount is smaller than the base line (when a graph is positioned higher than the base line), the image displayed on the display unit is not substantially influenced.

As shown in FIG. 6, in graph Q, the attenuation amount does not fall below the base line at any frequency (i.e., the graph is positioned higher than the base line). On the other hand, in both of graph R1 and graph R2, there are regions where the attenuation amount falls below the base line (i.e., the regions being positioned lower than the base line).

It is considered that the difference between the experimental result represented by graph Q and the experimental results represented by graphs R1 and R2 is attributed to whether FFC 200 and chassis unit 101 of the display panel are in contact discretely (graph Q) or continuously (graphs R1 and R2). In each of the experiments of graphs Q, R1, and R2, the sum of the lengths of FFC 200 being in contact with chassis unit 101 is equally 200 mm. However, from a comparison between graph Q and graphs R1 and R2, it can be seen that the attenuation amount of signals becomes greater when FFC 200 and chassis unit 101 are continuously in contact with each other, and the attenuation amount of signals becomes smaller when they are discretely in contact with each other.

From the foregoing, it can be seen that, in order to suppress the attenuation amount of signals transmitted through FFC 200, when FFC 200 and chassis unit 101 are brought into contact with each other, it is desirable that the contact portions are provided so as to be discrete from one another rather than to be continuous.

Note that, it is considered that the difference between the experimental result represented by graph R1 and the experimental result represented by graph R2 is attributed to whether FFC 200 and chassis unit 101 are in contact with each other by the elastic force or the like of FFC 200 (graph R1) or by the adhesive tape (graph R2). From a comparison between graph R1 and graph R2, it can be seen that the attenuation amount becomes greater when FFC 200 is fixed to chassis unit 101 using the adhesive tape. From the foregoing, it can be seen that it is desirable not to use an adhesive tape or the like in bringing FFC 200 and chassis unit 101 into contact with each other.

Next, graph P will be described. As shown in FIG. 6, comparing graph P and graph Q against each other, graph Q is slightly greater in the attenuation amount than graph P.

It is considered that the difference between the experimental result represented by graph P and the experimental result represented by graph Q is attributed to the difference in the contact area between FFC 200 and chassis unit 101 of the display panel. In the experiment of graph P, the width of the fold-back provided to crease 210 is several mm (about 5 mm). On the other hand, in the experiment of graph Q, the width of the fold-back provided to crease 210 is about 40 mm. From a comparison between graph P and graph Q, it can be seen that the attenuation amount becomes smaller as the contact area between FFC 200 and chassis unit 101 is smaller.

However, in both of graph P and graph Q, the attenuation amount does not fall below the base line (the graphs are positioned higher than the base line). Therefore, it is considered that the structure used at the experiment of graph P and the structure used at the experiment of graph Q pose substantially no problem in displaying the image. Accordingly, it is considered that the acceptable width of the fold-back provided to crease 210 is up to about 40 mm (posing substantially no problem to the displayed image).

From the foregoing, in the present exemplary embodiment, creases 210 are provided to FFCs 200 electrically connecting between signal circuit board 110 and TCon board 120, and FFCs 200 are disposed at display apparatus 100 such that the fold-backs provided to creases 210 are discretely in contact with chassis unit 101 of the display panel. In this manner, the contact portions between FFC 200 and chassis unit 101 are discretely disposed, and the contact area is relatively reduced. Thus, even when signals which are transmitted and received between the circuit boards are high-frequency signals (several GHz), the attenuation amount of the high frequency signals while being transmitted through FFC 200 can be reduced.

Note that, as described above, the width of the fold-back provided to each crease 210 is desirably as narrow as possible. However, it cannot physically be "0". The lower limit of the width of the fold-back provided to crease 210 is determined based on the physical property or the like of the material of FFC 200. From the foregoing, though the width of the fold-back provided to crease 210 is about 5 mm to 40 mm herein, the present exemplary embodiment does not limit the width of the fold-back provided to crease 210 to such values.

[1-3. Effect and Others]

As described above, in the present exemplary embodiment, an electronic device includes: a first circuit board on which a first circuit is mounted; a second circuit board on which a second circuit is mounted; a supporter; and a flexible flat cable. The flexible flat cable is disposed on the supporter and connects the first circuit board and the second circuit board to each other. The flexible flat cable transmits a signal between the first circuit and the second circuit. The flexible flat cable is provided with a crease. The flexible flat cable is disposed such that the crease is in contact with the supporter.

The flexible flat cable may be disposed such that a region projecting in an arc-shaped manner originating from the crease being in contact with the supporter is formed.

The flexible flat cable may have a plurality of creases. The flexible flat cable may be disposed such that an interval between adjacent ones of contact portions is smaller than an interval between adjacent ones of the creases, each of the contact portions is a portion where the crease is in contact with the supporter.

The flexible flat cable may include a shield surface and a signal surface. The crease may be formed such that the shield surface is valley-folded and the signal surface is mountain-folded.

Further, in the present exemplary embodiment, a display apparatus includes: a display panel having a display unit displaying an image and a supporter supporting the display unit; a first circuit board on which a first circuit is mounted; a second circuit board on which a second circuit is mounted; and a flexible flat cable. The flexible flat cable is disposed on the supporter and connects the first circuit board and the second circuit board to each other. The flexible flat cable transmits a signal between the first circuit and the second circuit. The flexible flat cable is provided with a crease. The flexible flat cable is disposed such that the crease is in contact with the supporter.

Note that, in the present exemplary embodiment, display apparatus 100 is one example of the above-described electronic device or display apparatus; chassis unit 101 is one example of the above-described supporter; the signal processing circuit is one example of the above-described first circuit; the drive circuit is one example of the above-described second circuit; signal circuit board 110 is one example of the above-described first circuit board; TCon board 120 is one example of the above-described second circuit board; FFC 200 is one example of the above-described flexible flat cable; crease 210 is one example of the above-described crease; interval We is one example of the above-described "interval between adjacent ones of contact portions"; interval Wa is one example of the above-described "interval between adjacent ones of the creases"; shield surface 206 is one example of the above-described shield surface; and signal surface 207 is one example of the above-described signal surface.

In conventional techniques, in an electronic device in which a plurality of circuit boards are connected to each other by an FFC, for the purpose of preventing surface contact between a supporter formed by a metal material and the FFC, generally measures for providing a clearance gap between the supporter and the FFC are taken, for example by supporting the FFC with a resin clamper or the like, or inserting an insulating member such as a sponge between the supporter and the FFC. Alternatively, for the purpose of preventing attenuation of signals even when surface contact occurs, measures may be taken by using a double-sided shield type FFC provided with shield layers for shielding electromagnetic noises at respective opposite surfaces, or a micro-coaxial cable. However, such measures are not desirable, because they may invite an increase in the number of components of the electronic device or in the cost of the components.

However, according to the present disclosure, as shown in the exemplary embodiment as one example, creases 210 provided to FFCs 200 are in contact with chassis unit 101 to thereby support FFCs 200. Therefore, without employing the structures of the conventional techniques, FFCs 200 can be kept on chassis unit 101 in a stable state while surface contact between FFCs 200 and chassis unit 101 is prevented. Furthermore, the contact portions between FFCs 200 and chassis unit 101 are discretely disposed, and the contact area is also relatively small. Therefore, even when signals which are transmitted and received between the circuit boards are high-frequency signals (several GHz), the attenuation amount of the high frequency signals while being transmitted through FFC 200 can be reduced.

Thus, even with an electronic device in which high frequency signals are transmitted and received between circuit boards and in which the spaced-apart distance between the circuit boards is relatively great, such as a liquid crystal television set including a large-screen 4k2k panel, the attenuation amount of high frequency signals transmitted through an FFC can be reduced. Accordingly, without employing the structures of the conventional techniques described above, high frequency signals can be stably transmitted and received between circuit boards via an FFC.

Other Exemplary Embodiments

In the foregoing, as an example of the technique disclosed in the present application, the first exemplary embodiment has been described. However, the technique of the present disclosure is not limited thereto, and the present technique can be applicable to exemplary embodiments obtained through modification, replacement, addition, omission and the like of the first exemplary embodiment. Further, it is also possible to obtain a new exemplary embodiment by combining the constituent elements described in the first exemplary embodiment.

Therefore, in the following, other exemplary embodiments will be exemplarily shown.

In the first exemplary embodiment, as one example of the electronic device, display apparatus 100 has been described. However, the electronic device is not limited to display apparatus 100. The electronic device is just required to include a plurality of circuit boards connected to each other by an FFC, wherein signals are transmitted and received between the circuit boards via the FFC. Accordingly, the electronic device may be a display apparatus including a panel other than liquid crystal panel (for example, an EL (Electro Luminescence) panel or the like), a video signal recording apparatus such as a video camera, a mobile terminal apparatus, a measuring apparatus, a manufacturing apparatus, a personal computer, a server computer or the like.

Further, in the first exemplary embodiment, as one example of the supporter, chassis unit 101 has been described. However, the supporter is not limited to chassis unit 101. With the electronic device including a plate-like element formed by a metal material (a metal plate or the like) as the supporter, the effect similar to that described in the present exemplary embodiment can be obtained.

Still further, with an FFC whose both the surfaces are the signal surfaces (that is, an FFC without the shield layer), by employing the structure similar to that described in the first exemplary embodiment, the effect similar to that described in the first exemplary embodiment can be obtained.

Still further, the signals transmitted through the FFC may not be high frequency signals of a GHz band. The signals transmitted through the FFC may be signals of a MHz band or a kHz band.

Still further, the first circuit may be a circuit other than the signal processing circuit, and the second circuit may be a circuit other than the drive circuit.

Note that, the numerical values described in the present exemplary embodiment such as the number of creases 210 provided to FFC 200, the interval of creases 210, and the width of the fold-back are merely an example, and the present disclosure is not limited to such numerical values. The number of the creases provided to the FFC, the interval of the creases, and the width of the fold-back and the like are desirably properly set according to the specification and size of the electronic device (or the display apparatus) in which the FFC is used, the material or size of the FFC and the like.

INDUSTRIAL APPLICABILITY

The present disclosure is applicable to an electronic device in which high frequency signals transmitted and received between circuit boards are transmitted through an FFC. Specifically, the present disclosure is applicable to a display apparatus such as a television receiver or a monitor apparatus, a video signal recording apparatus such as a video camera, a mobile terminal apparatus, a measuring apparatus, a manufacturing apparatus, a personal computer, a server computer and the like.

REFERENCE MARKS IN THE DRAWINGS 100 display apparatus
101 chassis unit
102 power supply circuit board
103 speaker
104 module unit
110 signal circuit board
111, 121 connector (receptacle connector)
112 terminal group
113, 114, 115 connector
120 TCon board (timing controller board)
200 FFC
201 conductor 202a, 202b insulating coat
203 dielectric
204 conductor
205 insulator
206 shield surface
207 signal surface
208 end
210 crease
300 wire harness
350 cable
400 adhesive tape

The invention claimed is:

1. An electronic device, comprising:
a first circuit board on which a first circuit is mounted;
a second circuit board on which a second circuit is mounted;
a supporter; and
a flexible flat cable disposed on the supporter and connecting the first circuit board and the second circuit board to each other, the flexible flat cable transmitting a signal between the first circuit and the second circuit, wherein:
the first circuit board and the second circuit board are mounted on the supporter,
the flexible flat cable is provided with a plurality of creases,
the supporter has a continuous surface at least from a first portion at which one of the plurality of creases closest to the first circuit board is mounted on the supporter to a second portion at which another of the plurality of creases closest to the second circuit board is mounted on the supporter, and
the flexible flat cable is disposed such that the plurality of creases are in contact with the continuous surface of the supporter.

2. The electronic device according to claim 1, wherein:
the flexible flat cable is disposed such that an interval between adjacent ones of contact portions is smaller than an interval between adjacent ones of the plurality of creases, and
each of the contact portions is a portion where a corresponding crease of the plurality of creases is in contact with the continuous surface of the supporter.

3. The electronic device according to claim 2, wherein a connecting portion of the flexible flat cable connected to one of the first and second circuit boards is located farther from the continuous surface than contact portions of the plurality of creases to the continuous surface.

4. The electronic device according to claim 1, wherein:
the flexible flat cable includes a shield surface and a signal surface, and
the plurality of creases are formed such that the shield surface is valley-folded and the signal surface is mountain-folded, the flexible flat cable being disposed such that a portion of the signal surface being mountain-folded is in contact with the continuous surface of the supporter.

5. The electronic device according to claim 1, wherein an entirety of the flexible flat cable is disposed on the supporter.

6. The electronic device according to claim 1, wherein the continuous surface is flat.

7. The electronic device according to claim 6, wherein the continuous surface extends below the first and second circuit boards.

8. The electronic device according to claim 1, wherein:
each of the plurality of creases is provided with a fold-back which is set to have a predetermined width such that the flexible flat cable has a plurality of fold-backs,
each of the plurality of fold-backs is formed at a corresponding portion of the flexible flat cable being mountain-folded, and
the flexible flat cable is disposed such that the plurality of fold-backs provided to the plurality of creases are discretely in contact with the continuous surface of the supporter.

9. An electronic device, comprising:
a first circuit board on which a first circuit is mounted;
a second circuit board on which a second circuit is mounted;
a supporter; and
a flexible flat cable disposed on the supporter and connecting the first circuit board and the second circuit board to each other, the flexible flat cable transmitting a signal between the first circuit and the second circuit, wherein:
the first circuit board and the second circuit board are mounted on the supporter,
the flexible flat cable is provided with a plurality of creases,
the supporter has a continuous surface at least from a portion at which one of the plurality of creases closest to the first circuit board is mounted on the supporter to a portion at which another of the plurality of creases closest to the second circuit board is mounted on the supporter,
the flexible flat cable is disposed such that the plurality of creases are in contact with the continuous surface of the supporter, and
the flexible flat cable is disposed such that regions, each of which projects in an arc-shaped manner originating from a corresponding one of the plurality of creases being in contact with the supporter, are formed.

10. A display apparatus, comprising:
a display panel having a display unit displaying an image and a supporter supporting the display unit;
a first circuit board on which a first circuit is mounted;
a second circuit board on which a second circuit is mounted; and
a flexible flat cable disposed on the supporter and connecting the first circuit board and the second circuit board to each other, the flexible flat cable transmitting a signal between the first circuit and the second circuit, wherein:
the first circuit board and the second circuit board are mounted on the supporter, the flexible flat cable is provided with a plurality of creases,
the supporter has a continuous surface at least from a first portion at which one of the plurality of creases closest to the first circuit board is mounted on the supporter to a second portion at which another of the plurality of creases closest to the second circuit board is mounted on the supporter, and
the flexible flat cable is disposed such that the plurality of creases are in contact with the continuous surface of the supporter.

11. The display apparatus according to claim 10, wherein an entirety of the flexible flat cable is disposed on the supporter.

12. The display apparatus according to claim 10, wherein:
the display panel includes a chassis supporting the display unit, and
the supporter is a part of the chassis.

13. The display apparatus according to claim 12, wherein the chassis is made of metal.

14. The display apparatus according to claim 10, wherein the continuous surface is flat.

15. The display apparatus according to claim 14, wherein the continuous surface extends below the first and second circuit boards.

16. The display apparatus according to claim 10, wherein
   each of the plurality of creases is provided with a fold-back which is set to have a predetermined width such that the flexible flat cable has a plurality of fold-backs,
   each of the plurality of fold-backs is formed at a corresponding portion of the flexible flat cable being mountain-folded, and
   the flexible flat cable is disposed such that the plurality of fold-backs provided to the plurality of creases are discretely in contact with the continuous surface of the supporter.

\* \* \* \* \*